US012509796B2

(12) United States Patent
Li et al.

(10) Patent No.: US 12,509,796 B2
(45) Date of Patent: Dec. 30, 2025

(54) PROCESS FOR GROWTH OF ATOMIC LAYER TRANSITION METAL DICHALCOGENIDES

(71) Applicant: Honda Motor Co., Ltd., Tokyo (JP)

(72) Inventors: Xufan Li, Fremont, CA (US); Avetik Harutyunyan, Santa Clara, CA (US)

(73) Assignee: Honda Motor Co., Ltd., Tokyo (JP)

( * ) Notice: Subject to any disclaimer, the term of this patent is extended or adjusted under 35 U.S.C. 154(b) by 273 days.

(21) Appl. No.: 18/206,457

(22) Filed: Jun. 6, 2023

(65) Prior Publication Data

US 2024/0410080 A1 Dec. 12, 2024

(51) Int. Cl.
*C30B 25/18* (2006.01)
*C30B 25/16* (2006.01)
*C30B 29/46* (2006.01)

(52) U.S. Cl.
CPC ............ *C30B 29/46* (2013.01); *C30B 25/165* (2013.01); *C30B 25/18* (2013.01)

(58) Field of Classification Search
CPC ........ C30B 29/46; C30B 25/165; C30B 25/18
See application file for complete search history.

(56) References Cited

U.S. PATENT DOCUMENTS 10,832,906 B2 11/2020 Li et al.
11,519,068 B2 * 12/2022 Harutyunyan .... H01L 21/02485
11,639,546 B2 * 5/2023 Harutyunyan ........ C23C 16/305 117/88
2007/0158789 A1 * 7/2007 Faris .................... C12Q 1/6825 257/635

OTHER PUBLICATIONS

T. li et al., Nature Nanotechnology, 2021, 16, 1201, and Supplementary Information (34 pages).
H. Yu et al., ACS Nano, 2017, 11, 12001-12007.
D. Dumcenco et al., ACS Nano, 2015, 9, 4611-4620.
Z. Wei et al., Nano Research, 2021, 14, 1598-1608.
X. Li et al., ACS Nano, 2015, 9, 8078-8088.
Kim, et al., Suppressing Nucleation in Metal-Organic Chemical Vapor Deposition of MoS2 Monolayers by Alkali Metal Halides, Nano Letters 2017 17 (8), p. 5056-5063.

* cited by examiner

*Primary Examiner* — Robert M Kunemund
(74) *Attorney, Agent, or Firm* — Patterson + Sheridan, LLP

(57) ABSTRACT

The present disclosure generally relates to processes for forming a two-dimensional single atomic layer transition metal dichalcogenide (TMD). The present disclosure also generally relates to a two-dimensional single atomic layer TMD formed by the process. In an embodiment, a process for forming a continuous TMD film is provided. The process includes flowing a carrier gas into a processing volume of a processing chamber having a substrate positioned therein; heating an alkali metal salt, a transition metal oxide, and a chalcogenide to form reactive species; and exposing the substrate to the reactive species to form a continuous TMD film, wherein: the continuous TMD film comprises crystals having an average grain size of about 50 μm to about 500 μm; the crystals of the continuous TMD film are aligned in the same crystallographic orientation; and the continuous TMD film consists of a single atomic layer of transition metal dichalcogenide.

20 Claims, 5 Drawing Sheets

FIG. 6A
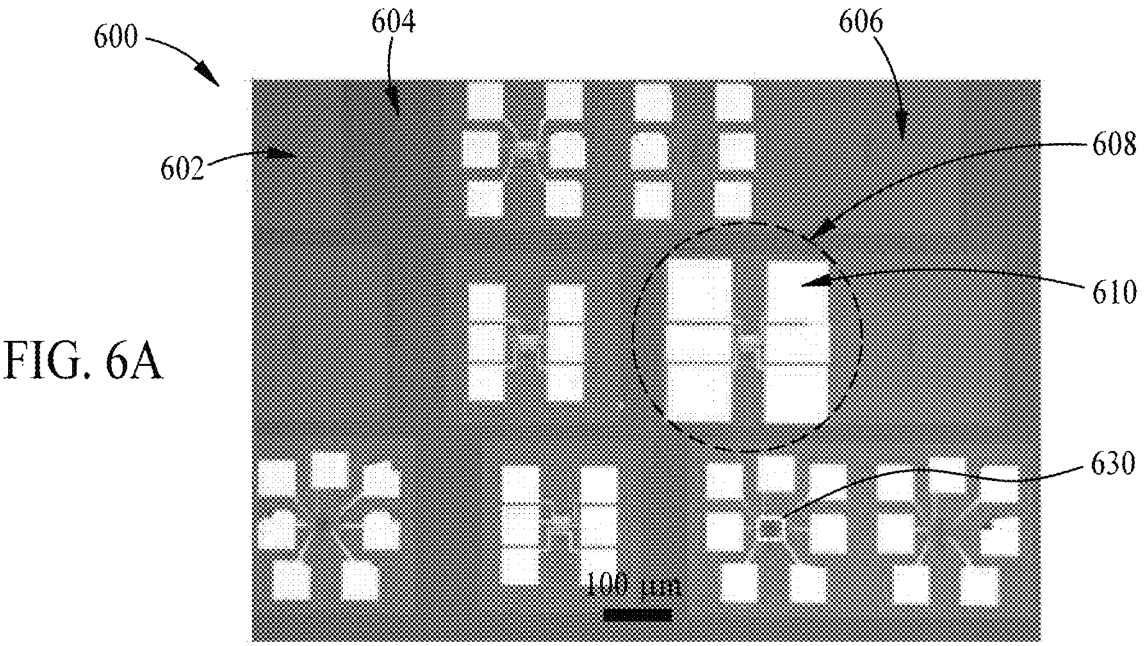
FIG. 6B
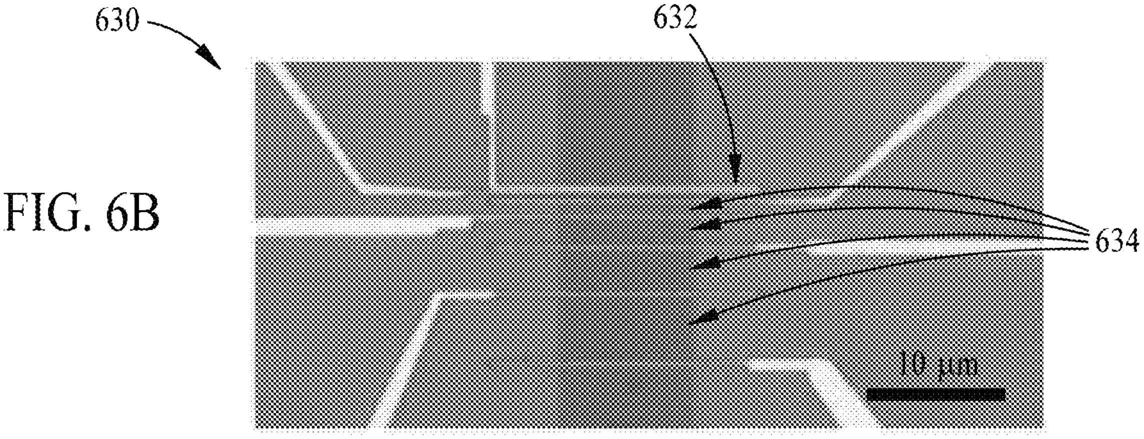
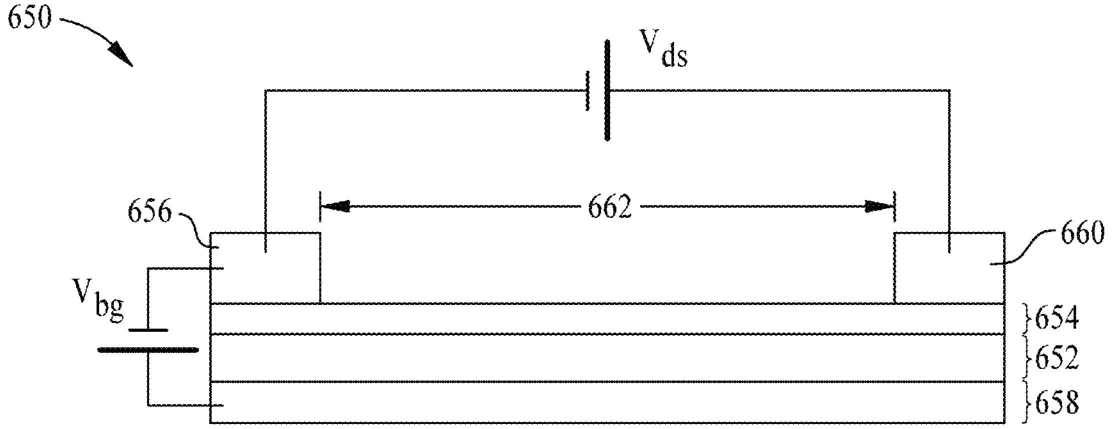
FIG. 6C

PROCESS FOR GROWTH OF ATOMIC LAYER TRANSITION METAL DICHALCOGENIDES

FIELD

The present disclosure generally relates to processes for forming a two-dimensional single atomic layer transition metal dichalcogenide. The present disclosure also generally relates to a two-dimensional single atomic layer transition metal dichalcogenide formed by the process.

BACKGROUND

Two-dimensional (2D) single atomic layer (SL) transition metal dichalcogenides (TMDs) are a subject of investigation in both fundamental science and practical applications. Due to having only single atomic layer thickness, direct band structures, good carrier mobility, and high on-off ratio, SL TMDs have promising use in electronics, especially for breaking the limit on scaling-down of semiconductor transistors. For realizing industrial-level applications of SL TMDs in electronics, the growth of large-area (centimeter scale), uniform, and high-electronic quality SL TMD films is of great importance. Conventional technologies to grow high-quality semiconductor films rely on epitaxial growth. Conventional epitaxy requires a highly matched lattice structure between the substrate and grown material. The layered structure of 2D TMDs, with van der Waals (vdW) interlayer forces, enables vdW epitaxy that can break the limit of traditional epitaxy and allow for a large lattice mismatch between the substrate and 2D layers. State-of-the-art technologies have demonstrated centimeter-scale epitaxial growth of SL $MoS_2$ film on sapphire (c-plane) substrates. However, the single grain size of the films formed by conventional technologies is small, generally less than 10 μm, because the larger the grain size the more challenging it becomes to align them in the same crystallographic orientation. In addition, the small grain size of the film formed by conventional technologies increases the chance to form defects such as grain boundary, which lowers the quality of the film.

There is a need for new and improved two-dimensional single atomic layer transition metal dichalcogenides and for new and improved processes for forming two-dimensional single atomic layer transition metal dichalcogenides.

SUMMARY

The present disclosure generally relates to processes for forming a two-dimensional single atomic layer transition metal dichalcogenide. The present disclosure also generally relates to a two-dimensional single atomic layer transition metal dichalcogenide formed by the process. Relative to conventional technologies, aspects described herein can enable epitaxial growth of large-area, uniform, single atomic layer transition metal dichalcogenide films having larger grain sizes, less defects, and matched crystallographic orientation. In some aspects, the epitaxial growth of two-dimensional single atomic layer transition metal dichalcogenide film with larger grain sizes and less defects can be enabled by alkali metal ions serving as a surfactant.

In an aspect, a process for forming a continuous transition metal dichalcogenide film is provided. The process includes flowing a carrier gas into a processing volume of a processing chamber having a substrate positioned therein. The process further includes heating an alkali metal salt, a transition metal oxide, and a chalcogenide to form reactive species. The process further includes exposing the substrate to the reactive species to form a transition metal dichalcogenide film, wherein: the transition metal dichalcogenide film comprises crystals having an average grain size of about 50 μm to about 500 μm; and the transition metal dichalcogenide film consists of a single atomic layer of transition metal dichalcogenide.

In another aspect, a process for forming a continuous TMD film is provided. The process includes flowing a carrier gas into a processing volume of a processing chamber having a substrate positioned therein. The process further includes heating an alkali metal salt, a transition metal oxide, and a chalcogenide to form reactive species. The process further includes exposing the substrate to the reactive species to form a continuous TMD film, wherein: the continuous TMD film comprises crystals having an average grain size of about 50 μm to about 500 μm; the crystals of the continuous TMD film are aligned in the same crystallographic orientation; and the continuous TMD film consists of a single atomic layer of transition metal dichalcogenide.

In another aspect, a process for forming a continuous single atomic layer transition metal dichalcogenide film is provided. The process includes exposing a substrate positioned in a processing volume of a chamber to a vapor formed from an alkali metal salt, a transition metal oxide, and a chalcogenide to deposit a continuous single atomic layer transition metal dichalcogenide film on the substrate, the continuous single atomic layer transition metal dichalcogenide film having: a thickness of about 1.1 nm or less; a width of about 500 μm to about 15 cm; and a length of about 500 μm to about 15 cm.

In another aspect, a controller configured to perform operations of a method described herein is provided.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, for the disclosure may admit to other equally effective aspects.

FIG. 6A is a large-scale optical microscope image showing an array of example FET devices made on patterned $MoS_2$ stripes from the film according to at least one aspect of the present disclosure.

FIG. 6B is an enlarged view of the boxed area in FIG. 6A, showing the contacts on the $MoS_2$ stripe as source and/or drain according to at least one aspect of the present disclosure.

FIG. 6C is an example device configuration incorporating an example 2D SL TMD according to at least one aspect of the present disclosure.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

The present disclosure generally relates to processes for forming a two-dimensional (2D) single atomic layer (SL) transition metal dichalcogenide (TMD). The present disclosure also generally relates to a 2D SL TMD formed by the process. The processes described herein can enable epitaxial growth of a large-single-grain size, large-area, continuous TMD film. 2D SL TMDs formed by aspects described herein can be uniform and have high electronic quality relative to those formed by conventional technologies. As a result, for example, 2D SL TMDs formed by aspects described herein can be utilized in a variety of applications, for example, electronics, optoelectronics, sensing, catalysis, energy storage, solar cells, light emitting diodes, photovoltaics, and photodetectors, among others. The 2D SL TMDs can be incorporated into devices such as transistors, for example, back-gate field effect transistors (FETs).

In some examples, the inventors show that processes described herein can enable control over the growth of the crystals and the resulting film. For example, processes of the present disclosure can enable the crystals to grow in a single crystallographic orientation. As a result, when the crystals grow together, there can be less defects such as grain boundaries in the film relative to films grown by conventional technologies. Moreover, aspects described herein can enable control over nucleation. Here, and in contrast to conventional technologies, processes of the present disclosure can enable the formation of a lower number of nucleation sites, but the crystals grown from each nucleation site are large. Such control over the growth and/or nucleation enabled by processes described herein can lead to, for example, a large-area 2D SL TMD with less defects such as grain boundaries and better matched crystallographic orientation relative to the state-of the art. Here, conventional technologies provide crystals having random crystallographic orientations, while other conventional epitaxy methods grow a large number of small-sized grains resulting in more defects (high defect density) in the film such as grain boundary. The grain boundary defect resulting from conventional technologies is a planar defect that occurs where two crystals of different orientation meet. In addition, aspects described herein can enable formation of high-electric quality films (for example, single crystal films).

The use of headings is for purposes of convenience only and does not limit the scope of the present disclosure. Embodiments described herein can be combined with other embodiments.

Figure 1:
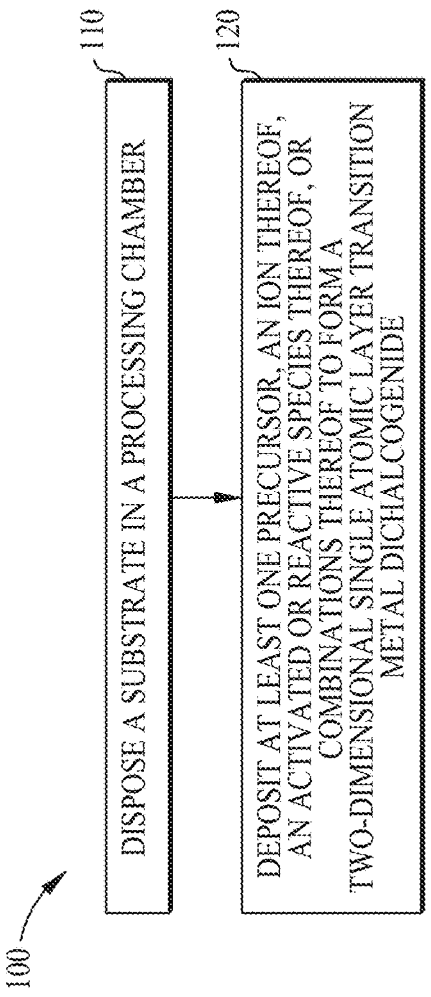
FIG. 1 shows selected operations of an example process for forming a two-dimensional (2D) single atomic layer (SL) transitional metal dichalcogenide (TMD) according to at least one aspect of the present disclosure.
Figure 2:
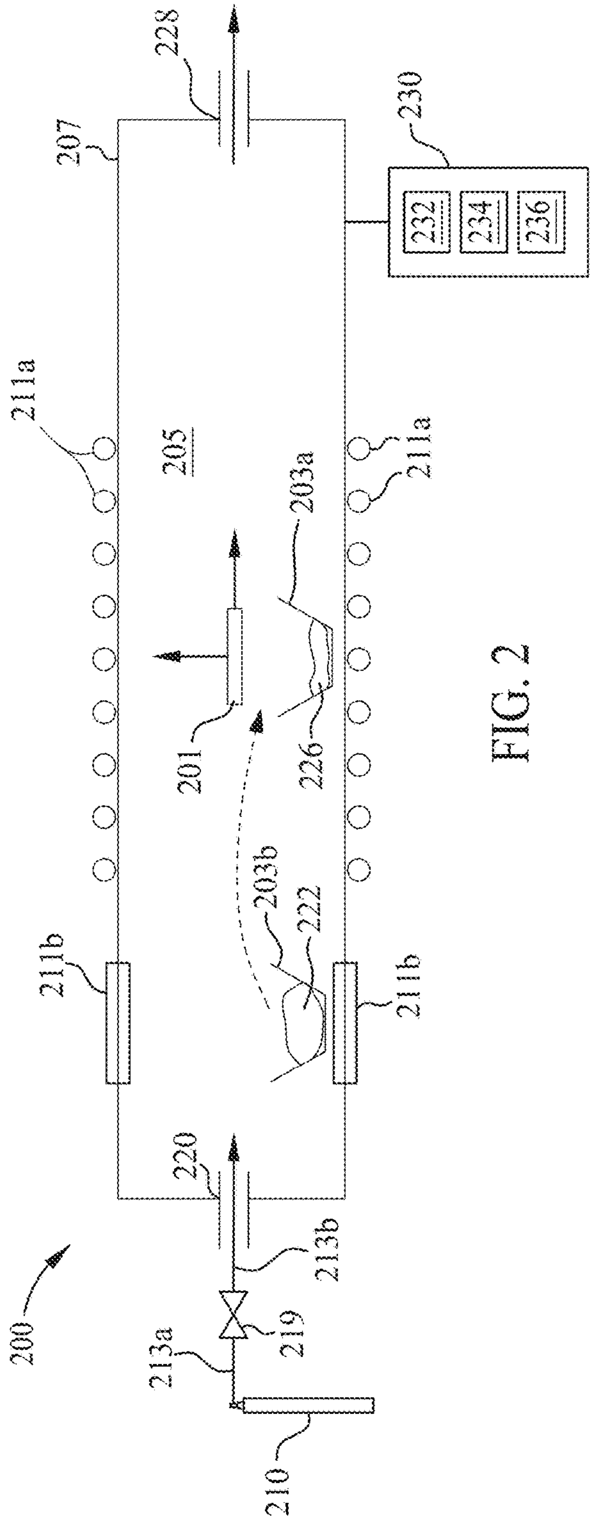
FIG. 2 is an example apparatus used to form a 2D SL TMD according to at least one aspect of the present disclosure.

Aspects of the present disclosure generally relate to processes for forming 2D SL TMDs. FIG. 1 shows selected operations of a process 100 for forming a 2D SL TMD according to at least one aspect of the present disclosure. FIG. 2 shows an apparatus 200 that can be used to form a 2D SL TMD according to at least one aspect of the present disclosure. The apparatus 200 is a non-limiting illustration only. Modifications and alterations of the apparatus 200 are contemplated. Process 100 can be utilized with apparatus 200 or any other suitable apparatus.

The apparatus 200 includes a processing chamber 207 such as a chemical vapor deposition (CVD) chamber or other suitable processing chambers. The processing chamber 207 can be a heating chamber. The processing chamber 207 can be a quartz tube. The processing chamber 207 includes an inlet 220 and an outlet 228. The processing chamber 207 is fluidly coupled to a gas tank 210 via a line 213*a*, junction/valve 219, and line 213*b*. The gas tank 210 includes a carrier gas such as hydrogen ($H_2$), helium (He), argon (Ar), krypton (Kr), neon (Ne), xenon (Xe), nitrogen ($N_2$), oxygen ($O_2$), or combinations thereof, such as Ar, $H_2$, or combinations thereof. When more than one carrier gas is utilized, more than one gas tank can be used. In some aspects, Ar can be utilized to grow TMDs where the chalcogenide includes sulfur. In at least one aspect, a mixture of carrier gases, such as Ar and $H_2$, can be utilized to grow TMDs where the chalcogenide includes selenium.

The carrier gas flows into the processing chamber 207 through the inlet 220 via lines 213*a*, 213*b*. Although not shown, mass flow controllers can be utilized to, e.g., measure and/or control the amount of gas(es) flowing through the lines 213*a*, 213*b* and into the processing chamber 207.

As an example, the carrier gas content of the gas(es) entering the processing chamber 207 can be controlled by adjusting the flow rate ratio of a first carrier gas ($FR_{C1}$) and a second carrier gas ($FR_{C2}$) using a mass flow controller. The flow rate ratio, $FR_{C1}/FR_{C2}$, for example, can be the flow rate of $H_2$ to the flow rate of Ar.

The apparatus 200 further includes a first heating mechanism 211*a* and a second heating mechanism 211*b* (collectively, heating mechanisms 211) serving to heat the processing chamber 207 and components therein. The heating mechanisms 211 can include a heating wire, a heating belt, an oven, a furnace, or other suitable apparatus. The heating mechanisms 211 can be operated independently to provide different amounts of heat to different locations of the chamber, as described below. For example, the first heating mechanism 211*a* can be operated at a first temperature, T1, and the second heating mechanism 211*b* can be operated at a second temperature, T2. As shown, the first heating mechanism 211*a* can include a heating wire and the second heating mechanism 211*b* can include a heating belt.

The apparatus 200 further includes a first tray 203*a* and a second tray 203*b* (collectively, trays 203). The trays 203 can be weigh boats, crucibles, flasks, or other suitable vessels that can withstand the temperatures of the processes disclosed herein. The trays 203 can be of any suitable shape and size. The first tray 203*a* is utilized to hold a mixture 226 that includes a first precursor comprising a salt (for example, an alkali metal salt) and a second precursor comprising a metal oxide.

The metal oxide (MO) can be a transition metal oxide. Any suitable transition metal can be used. In some aspects, the metal of the transition metal oxide comprises a Group 6 metal, such as chromium (Cr), molybdenum (Mo), tungsten (W), or combinations thereof, such as Mo, W, or combinations thereof. In at least one aspect, the transition metal oxide comprises molybdenum dioxide ($MoO_2$), molybdenum trioxide ($MoO_3$), tungsten dioxide ($WO_2$), tungsten trioxide ($WO_3$), or combinations thereof.

The salt can include an alkali metal (Group 1 of the periodic table of elements) and a halogen (Group 17 of the periodic table of elements) such that the salt can include an alkali metal salt. Examples of alkali metal elements that can be used for the alkali metal salt can include sodium (Na), potassium (K), rubidium (Rb), cesium (Cs), or combinations thereof, though lithium (Li), francium (Fr), or combinations thereof can optionally be used. Examples of the halogen elements that can be used for the alkali metal salt can include chlorine (Cl), bromine (Br), iodine (I), or combinations thereof, though fluorine (F), or astatine (At) can optionally be utilized. In some aspects the salt comprises an alkali metal salt made of the cation Na, K, Rb, and/or Cs, and the anion Cl, Br, and/or I. Illustrative, but non-limiting, examples of alkali metal salts can include NaCl, NaBr, NaI, KCl, KBr, KI, RbCl, RbBr, RbI, CsCl, CsBr, CsI, or combinations thereof.

The second tray 203*b* is utilized to hold a third precursor comprising a chalcogenide 222. The chalcogenide includes at least one chalcogen element such as sulfur (S), selenium (Se), tellurium (Te), or combinations thereof, such as S, Se, or combinations thereof. The chalcogenide 222 can be in the form of a powder such as sulfur powder or selenium powder. The second tray 203*b* can be upstream of the first tray 203*a*.

The first tray 203*a* is positioned between heating elements of the first heating mechanism 211*a*. The first heating mechanism 211*a* can be utilized to heat the mixture 226 of the alkali metal salt and the metal oxide disposed in the first tray 203*a*. During operation, the mixture 226 can be heated to a first temperature. The first temperature can be any suitable temperature, such as from about 500° C. to about 1,000° C., such as from about 600° C. to about 900° C., such as from about 650° C. to 850° C., such as from about 700° C. and 800° C. or from about 750° C. to about 800° C., though other temperatures are contemplated. Any of the foregoing numbers can be used singly to describe an open-ended range or in combination to describe a close-ended range. The mixture 226 can be heated under a flow of the carrier gas.

The second tray 203*b* is positioned between heating elements of the second heating mechanism 211*b*. The second heating mechanism 211*b* can be utilized to heat the third precursor comprising the chalcogenide 222 disposed in the second tray 203*b*. During operation, the chalcogenide 222 can be heated to a second temperature. The second temperature can be any suitable temperature such as from about 100° C. to about 500° C., such as from about 150° C. to about 450° C., such as from about 200° C. to about 400° C., such as from about 250° C. to about 350° C., though other temperatures are contemplated. In at least one aspect, the second temperature can be from about 130° C. to about 250° C., such as from about 175° C. to about 225° C., such as about 200° C., or from about 250° C. to about 450° C., such as from about 350° C. to about 400° C., though other temperatures are contemplated. Any of the foregoing numbers can be used singly to describe an open-ended range or in combination to describe a close-ended range. The chalcogenide 222 can be heated under a flow of the carrier gas.

The apparatus 200 further includes a controller 230 coupled to the processing chamber 207. The controller 230 can be used to regulate the heating mechanisms 211, the flow rate of carrier gas(es). The controller 230 can be configured to perform various operations of processes described herein.

The controller 230 includes a central processing unit (CPU) 232, a memory 236, and a support circuit 234 utilized to control, for example, the process sequence, regulate the gas flows from the gas tank, regulate the temperature of the heating mechanism (via, for example, a temperature sensor). The CPU 232 may be of any form of a general-purpose computer processor that may be used in an industrial setting. The software routines can be stored in the memory 236, such as random access memory, read only memory, floppy, or hard disk drive, or other form of digital storage. The support circuit 234 is conventionally coupled to the CPU 232 and may include cache, clock circuits, input/output systems, power supplies, and the like. Bi-directional communications between the controller 230 and the various components of the processing chamber 207 can be handled through numerous signal cables (not shown) referred to as signal buses.

During operation, deposition of a two-dimensional (2D) single atomic layer (SL) TMD, a substrate 201 is disposed within a processing volume 205 of the processing chamber 207. The substrate 201 is positioned above the first tray 203*a* and between heating elements of the first heating mechanism 211*a*. Examples of substrate the substrate 201 useful according to the present disclosure include, but are not limited to, substrates comprising or consisting of fluorphlogopite mica (F-mica, $KMg_3AlSi_3O_{10}F_2$, CAS No. 12003-38-2), $SiO_2$, Si, c-sapphire, $SrTiO_3$, hexagonal boron nitride (h-BN), highly oriented pyrolytic graphite (HOPG), or combinations thereof, such as F-mica, c-sapphire, or combinations thereof. It should be understood that while a F-mica substrate is used herein as an exemplary substrate, any suitable substrate can be used in addition to, or instead of, the same.

Returning to FIG. 1, process 100 can begin with disposing the substrate 201 in the processing chamber 207 at operation 110. The process further includes thermally depositing an alkali metal salt (and/or a reactive species thereof, e.g., an alkali metal), a metal oxide (and/or a reactive species thereof), and a chalcogenide (and/or a reactive species thereof) on the substrate 201 at operation 120.

The deposition/growth of operation 120 results in formation of a 2D SL TMD on the substrate 201. The 2D SL TMD can include molybdenum disulfide ($MoS_2$), molybdenum diselenide ($MoSe_2$) molybdenum ditelluride ($MoTe_2$), tungsten disulfide ($WS_2$), tungsten diselenide ($WSe_2$), tungsten ditelluride ($WTe_2$), or combinations thereof.

During processes described herein, the first precursor comprising the alkali metal salt, the second precursor comprising the metal oxide, and the third precursor comprising the chalcogenide are heated such that one or more of the precursors vaporizes and forms a vapor comprising reactive species of the first, second, and/or third precursors. Reactive species include activated species, atomic species, ions, radicals, high energy molecules, or combinations thereof, among other species.

At least a portion of the reactive species meet on a surface of the substrate 201 where a chemical reaction occurs to form 2D SL TMD crystals that grow into a 2D SL TMD film. The crystals can serve as nucleation sites. Once nucleation occurs, additional atoms can incorporate into the nucleated particle. In some examples, the vapor can include an alkali metal salt, a transition metal oxide, a chalcogenide, an activated species thereof, a reactive species thereof, an ion thereof, or combinations thereof.

Although conventional technologies have demonstrated centimeter-scale epitaxial growth of SL $MoS_2$ films on sapphire substrates, the grain size of the film is small (less than 10 μm), increasing the chance to form defects such as grain boundary leading to poorer quality films. In contrast, the crystallinity and single crystal grain sizes of TMDs grown can be controlled by aspects described herein. For example, the TMD crystal grain size can be much larger (in some examples greater than about 200 μm) than that grown by conventional technologies.

Here, the first precursor comprising the alkali metal salt can be heated to form a vapor comprising a reactive species (for example, activated species, atomic species, ions, radicals, high energy molecules, or combinations thereof) of the alkali metal salt. Such reactive species of the alkali metal salt can include an alkali metal cation, a halogen anion, or combinations thereof. In some aspects, the alkali metal salt, the alkali metal cation, halogen anion, or combinations thereof, can be deposited onto the substrate 201.

The second precursor comprising the transition metal oxide can be heated to form a vapor comprising a reactive species (for example, activated species, atomic species, ions, radicals, high energy molecules, or combinations thereof) of the transition metal oxide. The third precursor comprising the chalcogenide can be heated to form a vapor comprising a reactive species (for example, activated species, atomic species, ions, radicals, high energy molecules, or combinations thereof) of the chalcogenide. As described above, at least a portion of the reactive species in the vapor meet on the substrate surface where a chemical reaction occurs to form 2D SL TMD crystals that grow into a 2D SL TMD film.

In some embodiments, an alkali metal cation present in the vapor formed from the alkali metal salt is deposited between a surface of the substrate 201 and the 2D SL TMD. The alkali metal cation can act as a surfactant to mediate the growth of the TMD, making the TMD aligned into a 2D SL TMD.

In some aspects, TMDs comprising sulfur can be deposited/grown using a carrier gas comprising or consisting of Ar. In at least one aspect, TMDs comprising selenium can be deposited/grown using a mixture of carrier gases, such as Ar and $H_2$.

Operation 120 can be performed under conditions effective to form the 2D SL TMD. The conditions of operation 120 can include one or more of the following operations/parameters:

(a) Heating the mixture 226 comprising the first and second precursors (the alkali metal salt and the metal oxide) at a first temperature such as from about 500° C. to about 1,000° C., such as from about 600° C. to about 900° C., such as from about 650° C. to 850° C., such as from about 700° C. and 800° C. or from about 750° C. to about 800° C., though other temperatures are contemplated. Any of the foregoing numbers can be used singly to describe an open-ended range or in combination to describe a close-ended range.

(b) Heating the third precursor comprising the chalcogenide 222 at a second temperature, such as from about 100° C. to about 500° C., such as from about 150° C. to about 450° C., such as from about 200° C. to about 400° C., such as from about 250° C. to about 350° C., though other temperatures are contemplated. Any of the foregoing numbers can be used singly to describe an open-ended range or in combination to describe a close-ended range. In at least one aspect, and when the chalcogenide comprises sulfur, the second temperature can be from about 130° C. to about 270° C., such as from about 175° C. to about 225° C., such as about 200° C., though other temperatures are contemplated. Any of the foregoing numbers can be used singly to describe an open-ended range or in combination to describe a close-ended range. In at least one aspect, and when the chalcogenide comprises selenium, the second temperature can be from about 250° C. to about 450° C., such as from about 350° C. to about 400° C., though other temperatures are contemplated. Any of the foregoing numbers can be used singly to describe an open-ended range or in combination to describe a close-ended range.

(c) Flowing one or more carrier gases (for example, $H_2$, He, Ar, Kr, Ne, Xe, $N_2$, or combinations thereof) into the processing chamber 207 before, during, and/or after heating one or more of the precursors. A flow rate of carrier gas can be from about 20 standard cubic centimeter per minute (sccm) to about 200 sccm, such as from about 50 sccm to about 150 sccm, such as from about 75 sccm to about 125 sccm, such as about 80 sccm, though other flow rates are contemplated. Any of the foregoing numbers can be used singly to describe an open-ended range or in combination to describe a close-ended range.

(d) When more than one carrier gas (a mixture of carrier gases) is utilized, a concentration of first carrier gas in the mixture of carrier gases can be from about 2% to about 20%, such as from about 5% to about 15%, such as from about 7% to about 10%, based on a total amount of carrier gas, though other concentrations are contemplated. Any of the foregoing numbers can be used singly to describe an open-ended range or in combination to describe a close-ended range. In some examples, and when the chalcogenide 222 includes sulfur, the carrier gas comprises Ar. In some examples, and when the chalcogenide 222 includes selenium, the carrier gas comprises a mixture of Ar and $H_2$. In some aspects, the concentration of $H_2$ in the mixture of Ar and $H_2$ can be from about 2% to about 20%, such as from about 5% to about 15%, such as from about 7% to about 10%, though other concentrations are contemplated. Any of the foregoing numbers can be used singly to describe an open-ended range or in combination to describe a close-ended range.

(e) A total growth duration of the 2D SL TMD can be any suitable period, such as from about 1 minute to about 10 minutes, such as from about 1 minute to about 5 minutes, such as from about 2 minutes to about 3 minutes, though other periods are contemplated. Any of the foregoing numbers can be used singly to describe an open-ended range or in combination to describe a close-ended range. The total growth duration is the growth duration to form the 2D SL TMD film.

(f) A growth duration to form SL TMD crystals can be about 1.5 minutes or less, such as about 1.25 minutes or less, such as about 1 minute or less.

(g) A weight ratio of metal oxide to alkali metal salt can be from about 1:0.01 to about 1:0.1, such as from about 1:0.03 to about 1:0.08, such as from about 1:0.05 to about 1:0.07, though other weight ratios are contemplated. Any of the foregoing numbers can be used singly to describe an open-ended range or in combination to describe a close-ended range.

(h) For growth of a 1 cm×1 cm film, a total weight of the metal oxide and alkali metal salt can be from about 0.5 milligrams (mg) to about 3 mg, such as from about 1 mg to about 2 mg, such as about 1.5 mg, though other amounts are contemplated. Any of the foregoing numbers can be used singly to describe an open-ended range or in combination to describe a close-ended range. In some aspects, and for growth of a 5 cm×5 cm film, a total weight of the metal oxide and alkali metal salt can be from about 2.5 mg to about 15 mg, such as from about 5 mg to about 10 mg, such as about 7.5 mg, though other amounts are contemplated. Any of the foregoing numbers can be used singly to describe an open-ended range or in combination to describe a close-ended range. In at least one aspect, and for growth of a 15 cm×15 cm film, a total weight of the metal oxide and alkali metal salt can be from about 7.5 mg to about 45 mg, such as from about 15 mg to about 30 mg, such as about 7.5 mg, though other amounts are contemplated. Any of the foregoing numbers can be used singly to describe an open-ended range or in combination to describe a close-ended range.

(i) For growth of a 1 cm×1 cm film, and when the chalcogenide is sulfur powder, the weight of sulfur powder can be from about 100 mg to about 500 mg, such as from about 300 mg to about 450 mg, such as about 400 mg, though other amounts are contemplated. Any of the foregoing numbers can be used singly to describe an open-ended range or in combination to describe a close-ended range. In some aspects, and for growth of a 5 cm×5 cm film, the amount of sulfur powder can be from about 500 mg to about 2,500 mg, such as from about 1,500 mg to about 2,250 mg, such as about 2,000 mg, though other amounts are contemplated. Any of the foregoing numbers can be used singly to describe an open-ended range or in combination to describe a close-ended range. In at least one aspect, and for growth of a 15 cm×15 cm film, an amount of sulfur powder can be from about 1,500 mg to about 7,500 mg, such as from about 4,500 mg to about 6,750 mg, such as about 6,000 mg, though other amounts are contemplated. Any of the foregoing numbers can be used singly to describe an open-ended range or in combination to describe a close-ended range.

(j) For growth of a 1 cm×1 cm film, and when the chalcogenide is selenium powder, the weight of selenium powder can be from about 10 mg to about 200 mg, such as from about 50 mg to about 150 mg, such as about 100 mg, though other amounts are contemplated. Any of the foregoing numbers can be used singly to describe an open-ended range or in combination to describe a close-ended range. In some aspects, and for growth of a 5 cm×5 cm film, the amount of selenium powder can be from about 50 mg to about 1,000 mg, such as from about 250 mg to about 750 mg, such as about 500 mg, though other amounts are contemplated. Any of the foregoing numbers can be used singly to describe an open-ended range or in combination to describe a close-ended range. In at least one aspect, and for growth of a 15 cm×15 cm film, the amount of selenium powder can be from about 150 mg to about 3,000 mg, such as from about 750 mg to about 2,250 mg, such as about 1,500 mg, though other amounts are contemplated. Any of the foregoing numbers can be used singly to describe an open-ended range or in combination to describe a close-ended range Any of the foregoing numbers can be used singly to describe an open-ended range or in combination to describe a close-ended range.

Figure 3A:
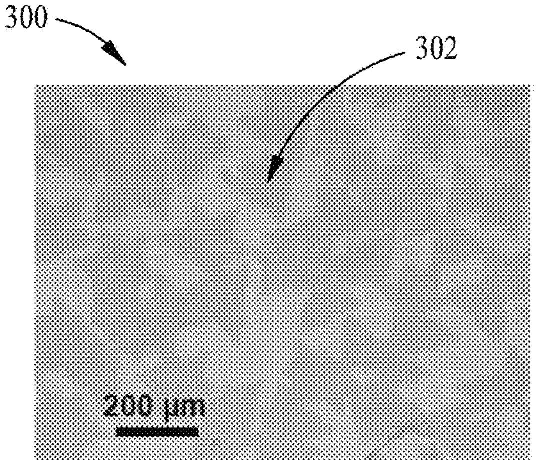
FIG. 3A is an optical microscope image of SL $MoS_2$ crystals after a shorter growth time of about 1 minute according to at least one aspect of the present disclosure.

In some aspects, an average grain size of a SL TMD crystal grown after about 1.5 minutes or less (such as about 1 minute or less) can be about 50 μm or more, such as about 100 μm or more, such as from about 150 μm to about 500 μm, such as from about 200 μm to about 450 μm, such as from about 250 μm to about 400 μm, such as from about 300 μm to about 350 μm, or from about 200 μm to about 250 μm, or from about 200 μm to about 225 μm, though other values are contemplated. Any of the foregoing numbers can be used singly to describe an open-ended range or in combination to describe a close-ended range. Average grain size is measured by the optical microscope image. The grain size is the lateral size of each triangular crystals, for example, as shown in FIG. 3A. Because the film is formed by merging of the triangular single crystals in FIG. 3A, a single grain refers to a single crystal triangle.

If desired, The average grain size can be adjusted by the total weight of the precursors (metal oxide+alkali metal salt), weight of the chalcogens, flow rate, growth temperature, and growth duration.

The SL TMD crystals can be grown in the same crystallographic orientation by using aspects described herein. By growing the crystals such that the crystals are aligned in the same crystallographic orientation, aspects described herein can enable epitaxial growth of 2D SL TMDs. Epitaxial growth refers to the crystals of the TMD film being aligned in the same crystallographic orientation, and those crystals of the TMD film also having a certain alignment relation with the crystallographic orientation of the substrate. This further shows epitaxial growth.

When growth duration is longer than about 1 minute (for example, about 2 minutes or more), the single SL TMD crystals grow larger and merge together to form a continuous 2D SL TMD film.

While not wishing to be bound by any theory, it is believed that the alkali metal ion of the alkali metal salt can act as a surfactant, and the surfactant can mediate the growth of the TMD, making the TMD aligned into a 2D SL TMD characterized as large-single-grain size, uniform, and large-area TMD with high electronic quality (for example, an ON/OFF ratio that is greater than about $10^6$ and a carrier mobility that is greater than about 20 $cm^2/Vs$). Further, and while not wishing to be bound by any theory, control over the alkali metal, the substrate, the metal oxide, and/or the surface energies thereof, can enable growth of 2D SL TMD islands that then grow into the 2D SL TMD.

The 2D SL TMD film grown according to aspects described herein can have one or more of the following properties:

(a) A thickness of the 2D SL TMD film can be about 1.2 nm or less, such as about 1.1 nm or less, such as about 1 nm or less, such as about 0.9 nm or less, though other thicknesses are contemplated. Any of the foregoing numbers can be used singly to describe an open-ended range or in combination to describe a close-ended range. The thickness is determined by atomic force microscopy as described in the Examples.

(b) A width (in one dimension) of the 2D SL TMD film can be about 500 μm or more, 15 centimeters (cm) or less, or combinations thereof, such as from about 500 μm to about 15 cm, such as from about 750 μm to about 12 cm, such as from about 1 cm to about 10 cm, such as from about 2 cm to about 4 cm, though other widths are contemplated. Any of the foregoing numbers can be used singly to describe an open-ended range or in combination to describe a close-ended range.

(c) A length (in one dimension) of the 2D SL TMD film can be about 500 μm or more, 15 centimeters (cm) or less, or combinations thereof, such as from about 500 μm to about 15 cm, such as from about 750 μm to about 12 cm, such as from about 1 cm to about 10 cm, such as from about 2 cm to about 4 cm, though other widths are contemplated. Any of the foregoing numbers can be used singly to describe an open-ended range or in combination to describe a close-ended range. The width and the length of the 2D SL TMD make up an area of the 2D SL TMD.

(d) An average grain size of a SL TMD film grown after about 1.5 minutes or less (such as about 1 minute or less) can be about 50 μm or more, such as about 100 μm or more, such as from about 150 μm to about 500 μm, such as from about 200 μm to about 450 μm, such as from about 250 μm to about 400 μm, such as from about 300 μm to about 350 μm, or from about 200 μm to about 250 μm, or from about 200 μm to about 225 μm, though other values are contemplated. Any of the foregoing numbers can be used singly to describe an open-ended range or in combination to describe a close-ended range.

In some aspects, the continuous TMD film comprises, consists essentially of, or consists of crystals aligned in the same crystallographic orientation. In at least one aspect, the continuous TMD film consists of crystals aligned in the same crystallographic orientation (all crystals have matched crystallographic orientation). The crystallographic orientation of the crystals in TMD film have a certain alignment relation with the crystallographic orientation of the substrate.

The inventors found that aspects of the present disclosure can enable a large average grain size of the film. Such a single crystal domain size produced by embodiments described herein is distinctive from conventional technologies and provides a variety of benefits. At the same time, the TMD film is a single atomic layer and has a large area. In contrast, and as described herein, conventional technologies have very small single grain sizes (generally less than 10 μm).

2D SL TMDs formed by aspects described herein show better uniformity and improved electronic quality relative to those formed by conventional technologies. As a result, for example, 2D SL TMDs formed by aspects described herein can be utilized in a variety of applications, for example, energy storage, electronics, optoelectronics, sensing, catalysis, solar cells, light emitting diodes, photovoltaics, and photodetectors, among others. The 2D SL TMDs can be incorporated into devices such as transistors, for example, back-gate field effect transistors (BG-FETs).

In some examples, the electrical characteristics of BG-FETs with 2D SL TMD channels formed by processes described herein are significantly improved over those TMDs made by traditional methods. In some examples, an ON/OFF current ratio of a 2D SL TMD described herein can be about $10^8$ or more, or about $10^9$ or more, which is a much larger ON/OFF current ratio than those TMDs formed by conventional methods. In some examples, 2D SL TMDs formed by processes described herein can have a carrier mobility that is about 20 $cm^2/V \cdot s$ or more, representing a carrier mobility value that is much larger those TMDs formed by conventional methods. The carrier mobility value can be influenced by the channel length due to, for example, contact resistance. Such on/off current ratios and carrier mobilities for back-gate TMD FET devices demonstrate that processes described herein can form 2D SL TMDs of high electronic quality.

Unlike conventional methods, aspects of the present disclosure can enable growth of a continuous 2D SL TMD film, the continuous 2D SL TMD film comprising crystals having a large average crystal grain size (for example, from about 50 μm to about 500 μm), and the crystals of the continuous 2D SL TMD film are aligned in the same crystallographic orientation.

The following examples are put forth so as to provide those of ordinary skill in the art with a complete disclosure and description of how to make and use aspects of the present disclosure, and are not intended to limit the scope of aspects of the present disclosure. Efforts have been made to ensure accuracy with respect to numbers used (e.g. amounts, dimensions, etc.) but some experimental errors and deviations should be accounted for.

EXAMPLES

1. Characterization Methods

Optical microscope images were collected using a Renishaw in Via Raman microscope. Atomic force microscopy (AFM) images and the corresponding height profiles were collected using a Bruker Dimension Icon AFM.

Reflection high energy electron diffraction (RHEED) pattern were collecting using a home-built RHEED system attached to a molecular beam epitaxy (MBE) chamber. Photoluminescence (PL) spectra were acquired using a Renishaw in Via Raman microscope, with 1800 grooves/mm grating and a 532 nm laser, 1 mW laser power, as excitation source. Optical images were collected using a digital camera.

2. Example Single Atomic Layer TMD Synthesis

Growth of a continuous 2D SL TMD was performed according to the following non-limiting procedure. The 2D SL TMD was synthesized through a CVD method conducted in a tube furnace system equipped with a 1" quartz tube.

For a typical run for the growth of epitaxial SL $MoS_2$ crystals or continuous film, a mixture of $MoO_2$+RbBr powder (total of about ~1.5 mg) at a weight ratio of $MoO_2$:RbBr of about 1:0.08 was loaded in an alumina boat (Coors high alumina combustion boat, Sigma-Aldrich), and a freshly-cleaved F-mica substrate (1×1 $cm^2$) was placed in the same alumina boat, about 3 mm above the $MoO_2$+RbBr mixture powder. This alumina boat is then placed at the center of the quartz tube. Sulfur powder (about 100 mg) was loaded in another alumina boat, and was placed upstream of the alumina boat with the mixture of $MoO_2$+RbBr powder. The alumina boat holding the sulfur powder was placed about 16 inches away from the center of the quartz tube. The quartz tube was then sealed on both sides, followed by flushing with about 500 sccm Ar for about 1 hour. After flushing, the Ar flow was adjusted to about 80 sccm, and the furnace is heated to about 770° C., which is the temperature at the center of the quartz tube, and meanwhile the S powder was heated to about 200° C. with an additional heating belt. The growth time at 770° C. was about 1-2 minutes, after which the temperature was cooled down rapidly with a fan. This procedure provided the continuous 2D SL TMD $MoS_2$ film.

The process was also repeated using various materials to provide continuous films and crystals of 2D SL $MoSe_2$, continuous films and crystals of 2D SL $WS_2$, and continuous films and crystals of 2D SL $WSe_2$. Properties of the continuous films and crystals of 2D SL TMDs were determined. Characterization of the $MoS_2$ below. The other TMDs provided similar results.

3. Characterization of Example SL $MoS_2$

Figure 3B:
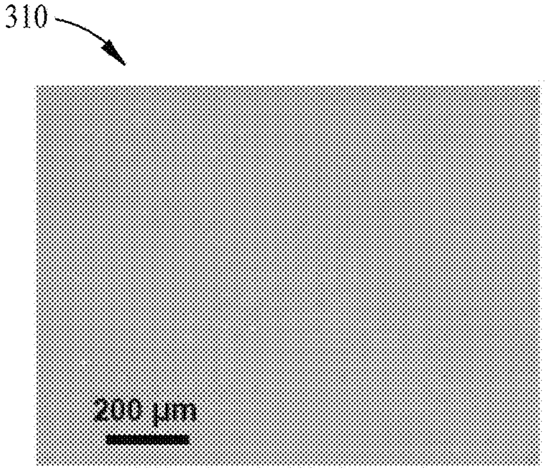
FIG. 3B is an optical microscope image of fully continuous SL $MoS_2$ film after a growth time of about 2 minutes according to at least one aspect of the present disclosure.

FIG. 3A is an optical microscope image 300 (scale: 200 μm) of SL $MoS_2$ crystals after a growth time of about 1 minute. The film is not fully continuous after this growth time, showing individual crystals. Numeral 302 indicates a single $MoS_2$ crystal. FIG. 3B is an optical microscope image 310 (scale: 200 μm) of a fully continuous SL $MoS_2$ film after a longer growth time (about 2 minutes).

Referring back to FIG. 3A, each triangle is a single crystal flake, and the crystal flakes are all aligned at the same crystallographic orientation (some triangles are rotated by 60° but have the same crystallographic orientation due to the lattice symmetry of $MoS_2$). This result indicates the epitaxial growth of SL $MoS_2$ crystals. FIG. 3A also shows that the size of the single crystals are about 200 μm. With a longer growth time, and as shown in FIG. 3B, the single crystals grow larger and merge together to form a continuous SL film as shown. Such results indicate that processes described herein can enable grain sizes (the size of each single crystal) to be larger than about 200 μm.

Figure 3C:
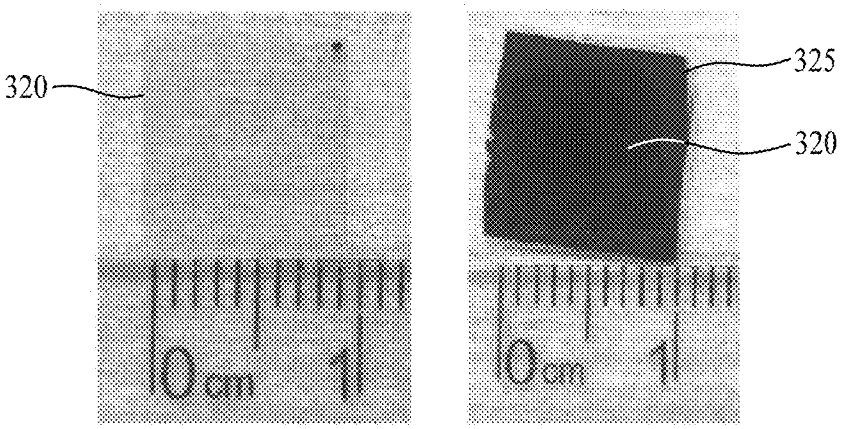
FIG. 3C shows an optical image of a fluorphlogopite mica (F-mica) substrate fully covered with an as grown continuous SL $MoS_2$ film (left panel) and an optical image of the continuous SL $MoS_2$ film transferred on a 285 nm $SiO_2$/Si substrate (right panel) according to at least one aspect of the present disclosure.
Figure 3D:
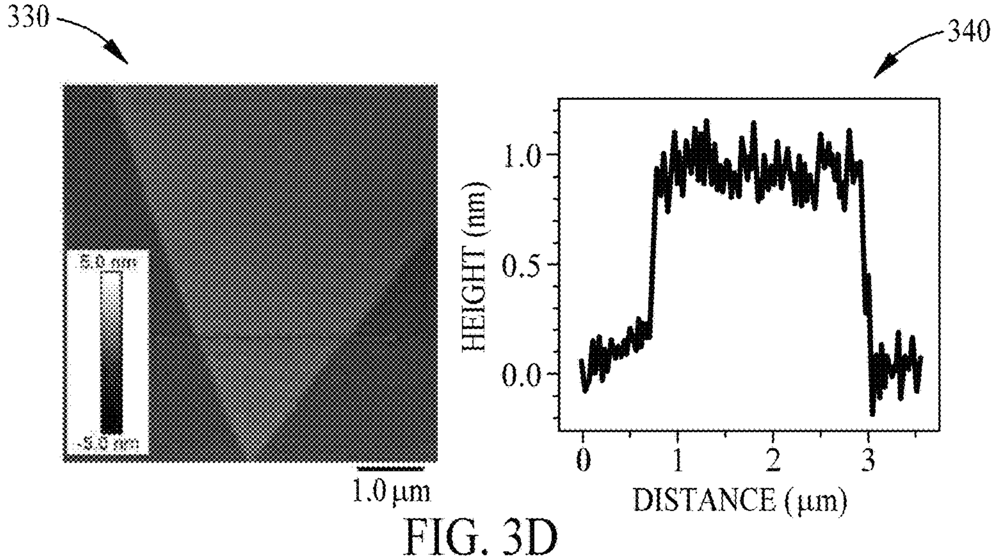
FIG. 3D shows an atomic force microscopy (AFM) image of a single crystal $MoS_2$ (left panel) and the corresponding height profile (right panel) along the arrow according to at least one aspect of the present disclosure.

The left panel of FIG. 3C shows an optical image of a 1 cm×1 cm fluorphlogopite mica (F-mica, $KMg_3AlSi_3O_{10}F_2$, CAS No. 12003-38-2) substrate fully covered with a continuous SL $MoS_2$ film 320. The right panel of FIG. 3C shows an optical image of the 1 cm×1 cm continuous SL $MoS_2$ film 320 transferred from the F-mica substrate and onto a 285 nm (thick) $SiO_2$/Si substrate 325 according to at least one aspect of the present disclosure FIG. 3D is an atomic force microscopy (AFM) image 330 of a single crystal $MoS_2$ (left panel). The right panel of FIG. 3D shows the corresponding height profile 340 along the arrow shown in the left panel. The thickness of the crystal was determined to be about 0.9 nm, corresponding to a single atomic layer of $MoS_2$.

Figure 4A:
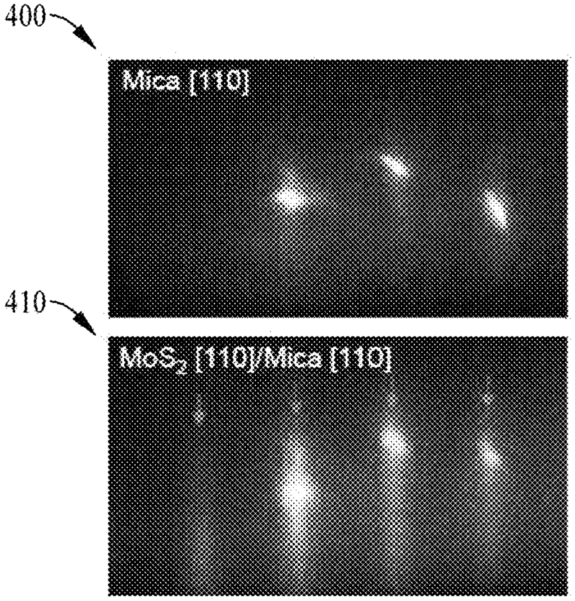
FIG. 4A shows a reflection high energy electron diffraction (RHEED) pattern of blank F-mica along mica [110] plane (top panel) and a RHEED pattern of F-mica with SL $MoS_2$ film along $MoS_2$ [110]/mica [110] (bottom panel) according to at least one aspect of the present disclosure.
Figure 4B:
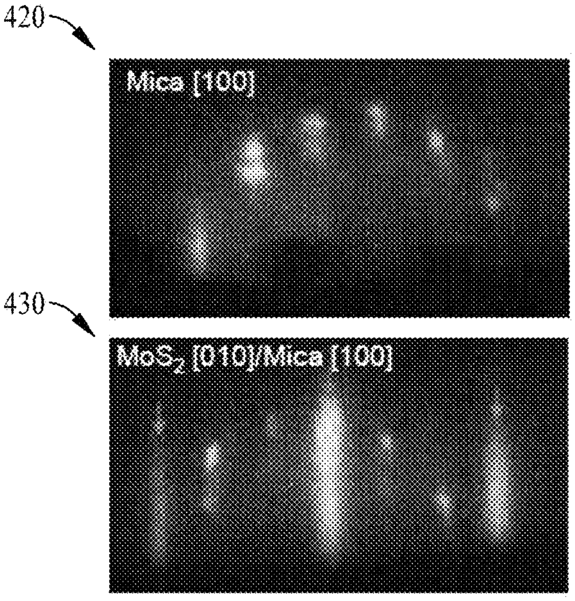
FIG. 4B shows a RHEED pattern of blank F-mica along mica [100] plane (top panel), by rotating the substrate by 30° from FIG. 4A, and a RHEED pattern along SL $MoS_2$ [010]/mica [100] (bottom panel) according to at least one aspect of the present disclosure.

Crystal surfaces at atomic levels were investigated by reflection high energy electron diffraction (RHEED) analyses. Exemplary, but non-limiting, results are shown in FIGS. 4A and 4B. The top panel of FIG. 4A shows a RHEED pattern 400 of blank F-mica along mica [110] direction. The set of spots is diffraction from mica (110) plane. The bottom panel of FIG. 4A shows a RHEED pattern 410 along F-mica [110] with an SL $MoS_2$ film [110]. In addition to the same set of spots from mica (110), the rod-shaped diffraction pattern as indicated by the arrows are from 2D $MoS_2$ (110) plane. The rod-shaped pattern shown indicates that the $MoS_2$ is a 2D layer.

The top panel of FIG. 4B shows a RHEED pattern 420 of blank F-mica along mica [100] direction, by rotating the substrate by 30° from FIG. 4A. The set of spots is diffraction from mica (100) plane. The bottom panel of FIG. 4B shows a RHEED pattern 430 along $MoS_2$ [010]/mica [100]. The rod-shaped diffraction pattern as indicated by the arrows are from $MoS_2$ (010) plane, corresponding to 30° from $MoS_2$ (110). The RHEED pattern shows a certain crystallographic alignment between $MoS_2$ and mica ([110]/[110] and [010]/[100]), verifying the epitaxial growth of SL $MoS_2$ film on F-mica. That is, embodiments described herein can enable the TMD crystals (and the crystals of the continuous 2D SL TMD film) to be aligned in the same crystallographic orientation, and the crystals of the TMD also have a certain alignment relation with the crystallographic orientation of the substrate.

Figure 5A:
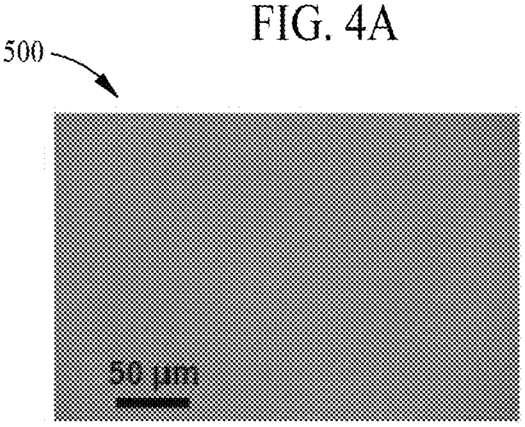
FIG. 5A is an optical microscope image of a continuous SL $MoS_2$ film on a 285 nm $SiO_2$/Si substrate according to at least one aspect of the present disclosure.
Figure 5B:
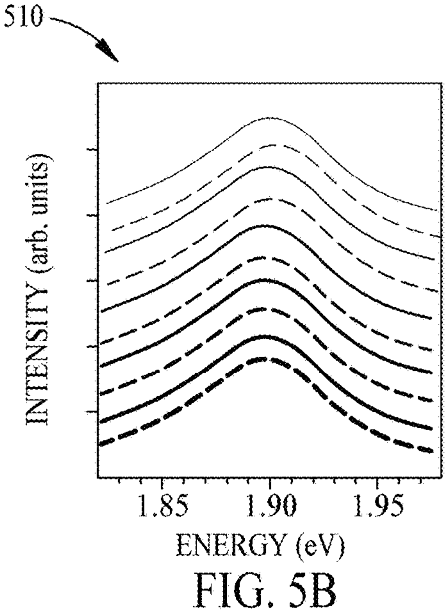
FIG. 5B shows photoluminescence (PL) spectra acquired from 10 randomly selected regions of the film in FIG. 5A according to at least one aspect of the present disclosure (spectra are offset for clarity).
Figure 5C:
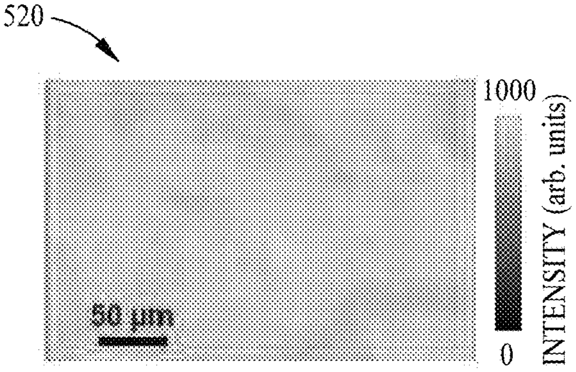
FIG. 5C is a mapping on integrated PL intensity of the film according to at least one aspect of the present disclosure.

Optical properties of the 2D SL $MoS_2$ film were also determined. Exemplary, but non-limiting, results are shown in FIGS. 5A-5C. Specifically, FIG. 5A shows an optical microscope image 500 of a continuous SL $MoS_2$ film on a 285 nm (thick) $SiO_2$/Si substrate. FIG. 5B shows photoluminescence (PL) spectra 510 acquired from 10 randomly selected regions of the film in FIG. 5A, with a laser excitation of 532 nm (wavelength). In FIG. 5B, the spectra are offset for clarity. The PL spectra show consistent peak position and intensity (no shift), indicating that the SL $MoS_2$ film has excellent optical qualities and has uniform optical quality. FIG. 5C is a mapping 520 on integrated PL intensity of the corresponding film, showing the excellent optical uniformity of the film.

4. Example Device Fabrication Electrical Property Measurements, and Electrical Performance A back-gate field effect transistor (BG-FET) using a Ni/Au as source and drain electrodes were fabricated to investigate the electrical performance of SL $MoS_2$ films. The BG-FET device was fabricated according to the following procedure. After transferring the SL $MoS_2$ film to a 285 nm $SiO_2$/Si (highly doped Si with an oxide layer of 285 nm) substrate, the SL $MoS_2$ film was patterned into arrays of 10-μm-wide stripes using e-beam lithography (EBL) and reactive-ion etching (RIE, $CF_4/O_2$, 50 W RF source/OW RF bias, 20 s), followed by patterning and deposition of metal electrodes of Ni (20 nm)+Au (50 nm) using EBL, e-beam evaporation and lift-off. EBL patterning was performed by Nanobeam n64 Electron Beam Writer system, the electron beam was operated at an accelerating voltage of 80 kV.

Selected properties of the fabricated devices were measured with a Keysight B1500A parameter analyzer in a Lakeshore probe station with a vacuum level of $5\times10^{-5}$ Torr at room temperature.

FIG. 6A is a large-scale optical microscope image 600 showing an array of example FET devices made on patterned $MoS_2$ stripes from the film according to at least one aspect of the present disclosure (scale: 100 μm). The large-scale optical microscope image 600 shows bare $SiO_2$ 602, a SL $MoS_2$ film 604, patterned SL $MoS_2$ stripes 606, a single FET device 608, and a gold pad 610 for the probe to touch and measure.

FIG. 6B is an enlarged view 630 of the boxed area in FIG. 6A, showing the contacts 632 on the $MoS_2$ stripe according to at least one aspect of the present disclosure (scale: 10 μm). The contacts 632 (Ni/Au) serve as source and/or drain. A series of contacts 632 are made with different channel lengths 634. Channel lengths ($L_{ch}$) investigated included about 0.5 μm, about 1 μm, about 2 μm, and about 3 μm.

FIG. 6C is an illustration of a back-gate field effect transistor (BG-FET) 650 configuration. A dielectric layer 652 (in this example, $SiO_2$) is positioned between the SL TMD film 654 (in this example, $MoS_2$) and the back gate 658 (in this example, highly-doped Si). Ni/Au contacts are deposited on the SL TMD film 654 to serve as the source electrode 656 and drain electrode 660. The channel 662 between the source electrode 656 and the drain electrode 660 had various lengths. Channel lengths ($L_{ch}$) investigated included about 0.5 μm, about 1 μm, about 2 μm, and about 3 μm. In FIG. 6C, $V_{ds}$ is the source-drain voltage, $I_{ds}$ is the source-drain current, and $V_{bg}$ is the back-gate voltage.

Figure 7B:
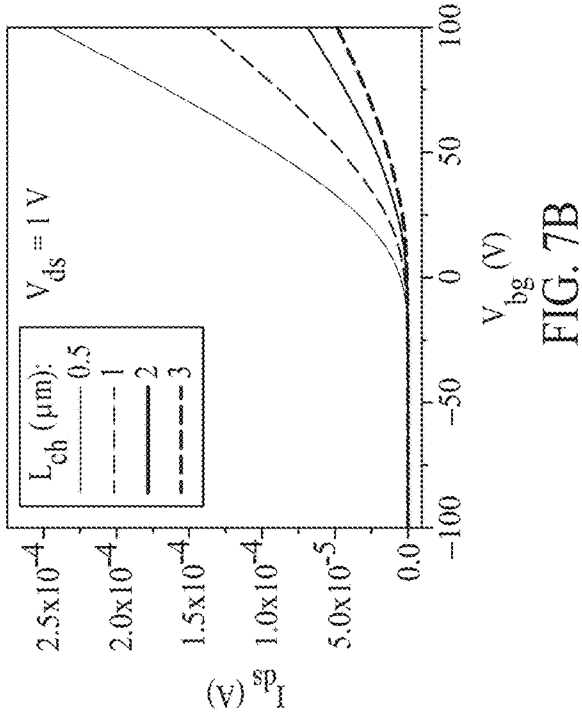
FIG. 7B shows transfer curves ($I_{ds}$ vs. $V_{bg}$) with a fixed $V_{ds}$=1 V of example devices, incorporating a 2D SL TMD, with different channel lengths according to at least one aspect of the present disclosure.
Figure 7A:
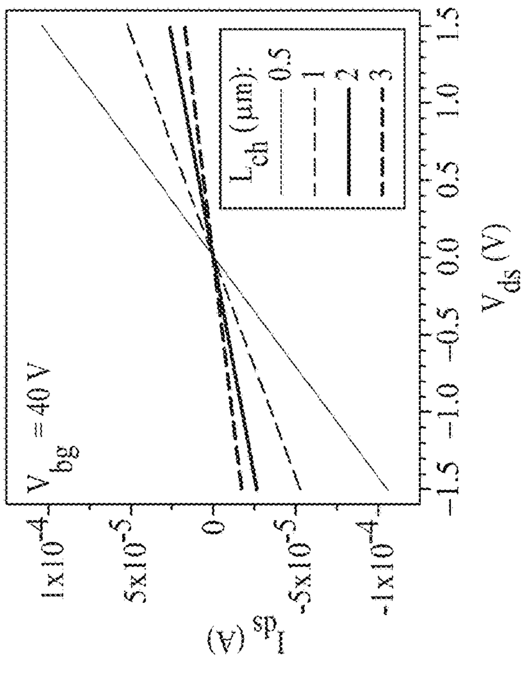
FIG. 7A shows output curves (source-drain current ($I_{ds}$) vs. source-drain voltage ($V_{ds}$)) with a fixed back-gate voltage ($V_{bg}$)=40 V of example devices, incorporating a 2D SL TMD, with different channel lengths according to at least one aspect of the present disclosure.
Figure 7D:
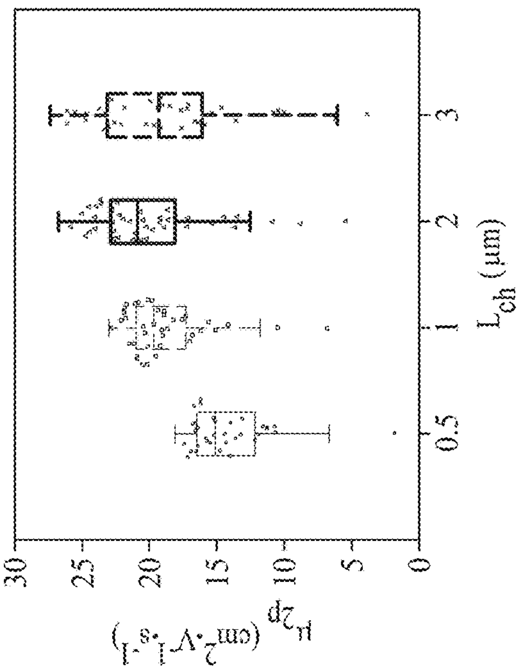
FIG. 7D shows data on carrier mobility ($\mu$) calculated from transfer curves from a total of 50 devices fabricated according to at least one aspect of the present disclosure.
Figure 7C:
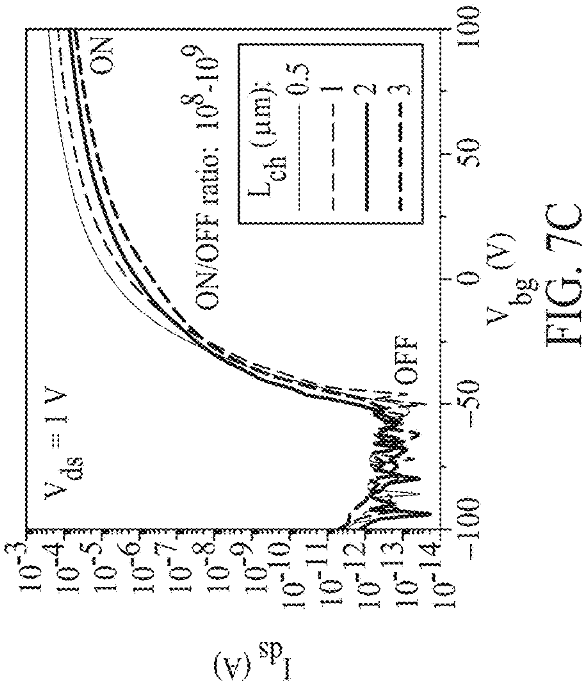
FIG. 7C shows the transfer curves in FIG. 7B with $I_{ds}$ in logarithmic scale.

Exemplary, but non-limiting, data for the electrical performance of devices are shown in FIGS. 7A-7D. FIG. 7A shows output curves ($I_{ds}$ vs $V_{ds}$) of example BG-FET devices with different channel lengths. The linear output curves indicate ohmic contact between the electrodes and the SL $MoS_2$. FIG. 7B shows transfer curves ($I_{ds}$ vs $V_{bg}$) of example BG-FET devices, indicating the n-type semiconductor behavior of the SL $MoS_2$. FIG. 7C shows the same transfer curves as shown in FIG. 7B with $I_{ds}$ in logarithmic scale. It was determined that the example back-gate $MoS_2$ FET devices have an ON/OFF ratio that is from about $10^8$ to about $10^9$, which is among the highest in back-gate $MoS_2$ FET devices reported.

FIG. 7D shows data on carrier mobility (μ) calculated from transfer curves from a total of 50 devices fabricated. Carrier mobility was calculated according to Equation (1):

$$\mu_{FET} = \frac{L_{ch}}{WC_{ox}} \times \frac{dI_{ds}}{dV_{bq} + V_{ds}} \tag{1}$$

In Equation (1), L/W is the ratio between channel length ($L_{ch}$) and width (width is 10 μm), $V_{ds}$ is the source-drain voltage, $I_{ds}$ is the source-drain current, and $V_{bg}$ is the back-gate voltage. In this model, the capacitance between channel and the back gate per unit area, Cox, is expressed as:

$$\varepsilon_{ox}\varepsilon_0/t_{ox} = 1.2 \times 10^{-8} F/\text{cm}^2$$

in which $\varepsilon_0$~$8.854\times10^{-14}$ F/cm is the permittivity of vacuum, $\varepsilon_{0x}$~3.9 is the relative permittivity of $SiO_2$, and $t_{0x}$=285 nm is the thickness of $SiO_2$.

Under the conditions investigated, carrier mobility values were determined to be from about 15 $cm^2/V\cdot s$ to about 30 $cm^2/V\cdot s$, with most appearing at about 20 $cm^2/V\cdot s$. For a short channel (for example, $L_{ch}$ is about 0.5 μm), it can be reasonable to have a little lower value as the mobility can be more influenced by the contact resistance. The carrier mobility values are also among the best in back-gate $MoS_2$ FET devices on $SiO_2$/Si reported. Overall, the electrical performance data demonstrates the high and uniform electronic quality of the epitaxial 2D SL $MoS_2$ film made according to aspects of the present disclosure.

Aspects described herein generally relate to processes for forming a two-dimensional (2D) single atomic layer (SL) transition metal dichalcogenide (TMD) and to 2D SL TMDs formed by the process. The processes described herein can enable growth of a large-single-grain size, epitaxial-quality, large-area TMD films. Overall, processes of the present disclosure can enable control over the nucleation and/or growth of crystals and films thereof Aspects Listing The present disclosure provides, among others, the following aspects, each of which can be considered as optionally including any alternate aspects:

Clause A1. A process for forming a continuous transition metal dichalcogenide film, the process comprising:

flowing a carrier gas into a processing volume of a processing chamber having a substrate positioned therein;

heating an alkali metal salt, a transition metal oxide, and a chalcogenide to form reactive species; and exposing the substrate to the reactive species to form a continuous transition metal dichalcogenide film, wherein:

the continuous transition metal dichalcogenide film comprises crystals having an average grain size of about 50 μm to about 500 μm;

the crystals of the continuous transition metal dichalcogenide film are aligned in the same crystallographic orientation; and the continuous transition metal dichalcogenide film consists of a single atomic layer of transition metal dichalcogenide.

Clause A2. The process of Clause A1, wherein the crystallographic orientation of the crystals of the continuous transition metal dichalcogenide film have a certain alignment relation with a crystallographic orientation of the substrate.

Clause A3. The process of Clause A1 or Clause A2, wherein:

the transition metal oxide comprises a Group 6 metal;

the substrate comprises fluorphlogopite mica; or combinations thereof.

Clause A4. The process of any one of Clauses A1-A3, wherein:

a width of the continuous transition metal dichalcogenide film is from about 500 μm to about 15 cm;

a length of the continuous transition metal dichalcogenide film is from about 500 μm to about 15 cm; or combinations thereof.

Clause A5. The process of any one of Clauses A1-A4, wherein the alkali metal salt comprises an alkali metal and a halogen, the alkali metal comprising Na, K, Rb, Cs, or combinations thereof, the halogen comprising Cl, Br, I, or combinations thereof.

Clause A6. The process of any one of Clauses A1-A5, wherein the chalcogenide comprises sulfur, selenium, or combinations thereof.

Clause A7. The process of any one of Clauses A1-A6, wherein the substrate comprises fluorphlogopite mica, $SiO_2$, Si, c-sapphire, $SrTiO_3$, hexagonal boron nitride (h-BN), or combinations thereof.

Clause A8. The process of any one of Clauses A1-A7, wherein the substrate comprises fluorphlogopite mica.

Clause A9. The process of any one of Clauses A1-A8, wherein the carrier gas comprises $H_2$, Ar, He, Ne, Kr, Xe, $N_2$, or combinations thereof.

Clause A10. The process of any one of Clauses A1-A9, wherein, when the chalcogenide comprises sulfur, the carrier gas comprises Ar.

Clause A11. The process of any one of Clauses A1-A10, wherein, when the chalcogenide comprises selenium:

the carrier gas comprises Ar and $H_2$; and a concentration of $H_2$ in the carrier gas is from about 2% to about 20% based on a total amount of Ar and $H_2$ in the carrier gas.

Clause A12. The process of any one of Clauses A1-A11, wherein the heating the alkali metal salt, the transition metal oxide, and the chalcogenide to form the reactive species comprises:

heating a mixture of the alkali metal salt and the transition metal oxide at a temperature that is from about 600° C. to about 900° C.;

heating the chalcogenide at a temperature that is from about 100° C. to about 500° C.; or combinations thereof.

Clause A13. The process of any one of Clauses A1-A12, wherein, when the chalcogenide comprises sulfur, the chalcogenide is heated at a temperature that is from about 130° C. to about 250° C.

Clause A14. The process of any one of Clauses A1-A13, wherein, when the chalcogenide comprises selenium, the chalcogenide is heated at a temperature that is from about 250° C. to about 450° C.

Clause B1. A process for forming a continuous single atomic layer transition metal dichalcogenide film, the process comprising:

exposing a substrate positioned in a processing volume of a chamber to a vapor formed from an alkali metal salt, a transition metal oxide, and a chalcogenide to deposit a continuous single atomic layer transition metal dichalcogenide film on the substrate, the continuous single atomic layer transition metal dichalcogenide film having:

a thickness of about 1.1 nm or less;

a width of about 500 μm to about 15 cm; and a length of about 500 μm to about 15 cm.

Clause B2. The process of Clause B1, wherein the crystallographic orientation of the crystals of the continuous single atomic layer transition metal dichalcogenide film have a certain alignment relation with a crystallographic orientation of the substrate.

Clause B3. The process of Clause B1 or Clause B2, wherein:

the exposing the substrate to the vapor comprises depositing crystals comprising a transition metal dichalcogenide, the crystals having an average grain size of about 50 μm to about 500 μm;

the crystals of the transition metal dichalcogenide film are aligned in the same crystallographic orientation; or combinations thereof.

Clause B4. The process of any one of Clauses B1-B3, wherein:

the transition metal oxide comprises a Group 6 metal;

the chalcogenide comprises S, Se, or combinations thereof, and the alkali metal salt comprises an alkali metal, the alkali metal comprising K, Rb, Cs, or combinations thereof.

Clause B5. The process of any one of Clauses B1-B4, wherein the single atomic layer transition metal dichalcogenide film comprises $MoS_2$, $MoSe_2$, $WS_2$, $WSe_2$, or combinations thereof.

Clause B6. The process of any one of Clauses B1-B5, further comprising flowing a carrier gas comprising Ar, H2, or combinations thereof during depositing of the single atomic layer transition metal dichalcogenide film.

Clause C1. A controller configured to perform operations comprising:

flowing a carrier gas into a processing volume of a processing chamber having a substrate positioned therein;

heating an alkali metal salt, a transition metal oxide, and a chalcogenide to form a vapor comprising reactive species; and exposing the substrate to the vapor to form a single atomic layer transition metal dichalcogenide film having a thickness of about 1.1 nm or less, the exposing the substrate to the vapor to form the continuous single atomic layer transition metal dichalcogenide film comprises:

depositing crystals comprising a single atomic layer transition metal dichalcogenide, the crystals having an average grain size of about 100 μm to about 500 μm; and depositing the transition metal dichalcogenide film on the crystals.

Clause C2. The controller of Clause C1, wherein:

the crystals of the transition metal dichalcogenide film are aligned in the same crystallographic orientation;

the transition metal oxide comprises a Group 6 metal;

the chalcogenide comprises S, Se, or combinations thereof, or the alkali metal salt comprises an alkali metal, the alkali metal comprising Na, K, Rb, Cs, or combinations thereof.

Clause C3. The process of Clause C1 or Clause C2, wherein the crystallographic orientation of the crystals of the transition metal dichalcogenide film have a certain alignment relation with the crystallographic orientation of the substrate.

Clause D1. A controller configured to perform of operations of a method described herein.

Clause E1. A continuous transition metal dichalcogenide film, comprising one or more of the following characteristics:

the continuous transition metal dichalcogenide film comprises crystals having an average grain size of about 50 μm to about 500 μm;

the crystals of the transition metal dichalcogenide film are aligned in the same crystallographic orientation;

the continuous transition metal dichalcogenide film consists of a single atomic layer of transition metal dichalcogenide;

the continuous single atomic layer transition metal dichalcogenide film has a thickness of about 1.1 nm or less;

the continuous single atomic layer transition metal dichalcogenide film has a width of about 500 μm to about 15 cm;

the continuous single atomic layer transition metal dichalcogenide film has a length of about 500 μm to about 15 cm; or combinations thereof.

Clause E2. The continuous transition metal dichalcogenide film of Clause E1, wherein the continuous transition metal dichalcogenide film, comprises all the characteristics of Clause E1.

Clause E3. The continuous transition metal dichalcogenide film of Clause E1 or E2, wherein the continuous transition metal dichalcogenide film is formed according to processes described herein.

Clause E4. The continuous transition metal dichalcogenide film of any one of Clauses E1-E3, wherein the continuous transition metal dichalcogenide film is formed by the process of any one of Clauses A1-A14; the process of any one of Clauses B1-B6; the controller of any one of Clauses C1-C3; or the controller of any one of Clauses D1-D2.

Clause E5. The process of Clauses E1-E5, wherein the crystallographic orientation of the crystals of the transition metal dichalcogenide film have a certain alignment relation with the crystallographic orientation of the substrate.

As is apparent from the foregoing general description and the specific aspects, while forms of the aspects have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa, e.g., the terms "comprising," "consisting essentially of," "consisting of" also include the product of the combinations of elements listed after the term.

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise. For example, aspects comprising "a precursor" include aspects comprising one, two, or more precursors, unless specified to the contrary or the context clearly indicates only one precursor is included.

While the foregoing is directed to aspects of the present disclosure, other and further aspects of the disclosure may be devised without departing from the basic scope thereof, and the scope thereof is determined by the claims that follow.

What is claimed is:

1. A process for forming a continuous transition metal dichalcogenide film, the process comprising:

flowing a carrier gas into a processing volume of a processing chamber having a substrate positioned therein;

heating a mixture of the alkali metal salt and the transition metal oxide and a chalcogenide to form reactive species; and exposing the substrate to the reactive species to form a continuous transition metal dichalcogenide film, wherein:

the continuous transition metal dichalcogenide film comprises crystals having an average grain size of about 100 μm to about 500 μm;

the crystals of the continuous transition metal dichalcogenide film are aligned in the same crystallographic orientation; and the continuous transition metal dichalcogenide film consists of a single atomic layer of transition metal dichalcogenide.

2. The process of claim 1, wherein the crystallographic orientation of the crystals of the continuous transition metal dichalcogenide film have a certain alignment relation with a crystallographic orientation of the substrate.

3. The process of claim 1, wherein:

the transition metal oxide comprises a Group 6 metal;

the substrate comprises fluorphlogopite mica; or combinations thereof.

4. The process of claim 1, wherein:

a width of the continuous transition metal dichalcogenide film is from about 500 μm to about 15 cm;

a length of the continuous transition metal dichalcogenide film is from about 500 μm to about 15 cm; or combinations thereof.

5. The process of claim 1, wherein the alkali metal salt comprises an alkali metal and a halogen, the alkali metal comprising Na, K, Rb, Cs, or combinations thereof, the halogen comprising CI, Br, I, or combinations thereof.

6. The process of claim 1, wherein the chalcogenide comprises sulfur, selenium, or combinations thereof.

7. The process of claim 1, wherein the substrate comprises fluorphlogopite mica, $SiO_2$, Si, c-sapphire, $SrTiO_3$, hexagonal boron nitride (h-BN), or combinations thereof.

8. The process of claim 1, wherein the substrate comprises fluorphlogopite mica.

9. The process of claim 1, wherein, when the chalcogenide comprises sulfur, the carrier gas comprises Ar.

10. The process of claim 1, wherein, when the chalcogenide comprises selenium:

the carrier gas comprises Ar and $H_2$; and a concentration of $H_2$ in the carrier gas is from about 2% to about 20% based on a total amount of Ar and $H_2$ in the carrier gas.

11. The process of claim 1, wherein the heating the mixture of the alkali metal salt and the transition metal oxide, and the chalcogenide to form the reactive species comprises:

heating the mixture of the alkali metal salt and the transition metal oxide at a temperature that is from about 600° C. to about 900° C.;

heating the chalcogenide at a temperature that is from about 100° C. to about 500° C.; or combinations thereof.

12. The process of claim 1, wherein, when the chalcogenide comprises sulfur, the chalcogenide is heated at a temperature that is from about 130° C. to about 250° C.

13. The process of claim 1, wherein, when the chalcogenide comprises selenium, the chalcogenide is heated at a temperature that is from about 250° C. to about 450° C.

14. A process for forming a continuous single atomic layer transition metal dichalcogenide film, the process comprising:

exposing a substrate positioned in a processing volume of a chamber to a vapor formed from a mixture of an alkali metal salt and a transition metal oxide, and a chalcogenide to deposit a continuous single atomic layer transition metal dichalcogenide film on the substrate, the continuous single atomic layer transition metal dichalcogenide film having:
a thickness of about 1.1 nm or less;
a width of about 500 μm to about 15 cm; and
a length of about 500 μm to about 15 cm.

15. The process of claim 14, wherein:
the exposing the substrate to the vapor comprises depositing crystals comprising a transition metal dichalcogenide, the crystals having an average grain size of about 50 μm to about 500 μm;
the crystals of the continuous single atomic layer transition metal dichalcogenide film are aligned in the same crystallographic orientation; or
combinations thereof.

16. The process of claim 14, wherein:
the transition metal oxide comprises a Group 6 metal;
the chalcogenide comprises S, Se, or combinations thereof; and
the alkali metal salt comprises an alkali metal, the alkali metal comprising K, Rb, Cs, or combinations thereof.

17. The process of claim 14, wherein the single atomic layer transition metal dichalcogenide film comprises $MoS_2$, $MoSe_2$, $WS_2$, $WSe_2$, or combinations thereof.

18. The process of claim 14, further comprising flowing a carrier gas comprising Ar, $H_2$, or combinations thereof during depositing of the single atomic layer transition metal dichalcogenide film.

19. A controller configured to perform operations comprising:
flowing a carrier gas into a processing volume of a processing chamber having a substrate positioned therein;
heating a mixture of the alkali metal salt and the transition metal oxide, and a chalcogenide to form a vapor comprising reactive species; and
exposing the substrate to the vapor to form a continuous single atomic layer transition metal dichalcogenide film having a thickness of about 1.1 nm or less, the exposing the substrate to the vapor to form the continuous single atomic layer transition metal dichalcogenide film comprises:
depositing crystals comprising a single atomic layer transition metal dichalcogenide, the crystals having an average grain size of about 100 μm to about 500 μm; and
depositing the transition metal dichalcogenide film on the crystals.

20. The controller of claim 19, wherein:
the crystals of the transition metal dichalcogenide film are aligned in the same crystallographic orientation;
the transition metal oxide comprises a Group 6 metal;
the chalcogenide comprises S, Se, or combinations thereof; and
the alkali metal salt comprises an alkali metal, the alkali metal comprising Na, K, Rb, Cs, or combinations thereof.

* * * * *